United States Patent [19]

Dessens et al.

[11] Patent Number: 4,673,864

[45] Date of Patent: Jun. 16, 1987

[54] CIRCUIT COMPRISING SERIES-CONNECTED SEMICONDUCTOR ELEMENTS

[75] Inventors: Petrus A. Dessens; Reiner F. Rumphorst, both of Eindhoven, Netherlands

[73] Assignee: U.S. Philips Corporation, New York, N.Y.

[21] Appl. No.: 785,622

[22] Filed: Oct. 7, 1985

[30] Foreign Application Priority Data

Oct. 16, 1984 [NL] Netherlands ........................ 8403148

[51] Int. Cl.[4] ............................................ H03K 17/18

[52] U.S. Cl. .................................... 323/221; 323/229; 323/298; 323/902

[58] Field of Search ............... 323/220, 221, 229, 270, 323/293, 297, 298, 352-354, 902

[56] References Cited

U.S. PATENT DOCUMENTS

| | | | |
|---|---|---|---|
| 3,202,905 | 8/1965 | Gomez | 323/221 |
| 3,321,631 | 5/1967 | Biard et al. | 323/902 X |
| 3,419,745 | 12/1968 | Wenzel | 323/221 X |
| 3,458,801 | 7/1969 | Polson | 323/270 |
| 3,500,173 | 3/1970 | Aiken | 323/221 |
| 4,384,259 | 5/1983 | Capewell | 323/902 X |

FOREIGN PATENT DOCUMENTS

| | | |
|---|---|---|
| 2400344 | 7/1975 | Fed. Rep. of Germany . |
| 2525362 | 10/1983 | France . |

*Primary Examiner*—Peter S. Wong
*Attorney, Agent, or Firm*—Robert T. Mayer; Bernard Franzblau

[57] ABSTRACT

A plurality of controlled avalanche semiconductor elements, are connected in series and are irradiated with a controllable quantity of light to form circuits which in principle can switch an unlimited high voltage or can control such a voltage. Dissipating auxiliary means to obtain a uniform voltage distribution cross the circuit are not required. As a light source, light-emitting diodes can be used so that the elements can be controlled at a low-voltage level and with DC separation the circuit can be used in high-voltage amplifiers, high-voltage regulators or high-voltage stabilizers, deflection voltage generators, high-voltage switches in X-ray apparatus, lasers, ignition systems in combustion engines etc.

16 Claims, 14 Drawing Figures

CIRCUIT COMPRISING SERIES-CONNECTED SEMICONDUCTOR ELEMENTS

BACKGROUND OF THE INVENTION

This invention relates to a circuit comprising series-connected semiconductor elements which are each provided with a controlled avalanche region.

It is a well known measure to arrange elements in series which are each capable of withstanding only a limited voltage in order that a higher voltage thus can be admitted across the whole bipole.

A problem arising in such a series arrangement is the voltage distribution between the elements. Solutions for this problem have already been suggested.

FIG. 1 of the Japanese Patent Application No. 118,357 of 1978 shows that more or less equal or admissible voltages are produced across the elements when each element has connected in parallel with it a resistor which provides a current distribution. FIG. 2 indicates that in the case of a rectifier subjected to a high reverse voltage each diode can be irradiated with light in order to produce, besides the (dark) leakage current, a further photocurrent, as a result of which a correct current distribution is also obtained. In the Philips Data Handbook for Semiconductors for the year 1980, Part S2 about Power Diodes, Thyristors, Triacs, there is indicated for the BYX 25 series on page "September 1979, 4" that there is also a third possibility of arranging in series elements or semiconductor elements and so in this case diodes without further steps being taken for obtaining a satisfactory voltage distribution. This possibility arises when the element has a controlled avalanche characteristic. The said devices are therefore of the type having a controlled avalanche characteristic.

SUMMARY OF THE INVENTION

According to the invention, the ideas of FIG. 2 of the said Japanese Patent Application are combined with the facts just mentioned about a "controlled avalanche" and the invention is therefore characterized in that the semiconductor elements are photosensitive and a controllable quantity of light can be supplied to each of them for the use of the circuit as a variable resistor of which the overall resistance is a function of the quantity of light to be supplied.

The surprising effect is now obtained that a variable resistor is realized as a bipolar element, across which a very high voltage can be applied. The circuit can consequently be used for controlling and switching currents at high voltages of the order of tens of kilovolts, in principle an unlimitedly high voltage, by arranging an appropriate number of the semiconductor elements in series. Other insulation problems may, however, then arise and have to be solved. Moreover, the advantage of a DC separation between a control circuit and the main circuit can be obtained.

The semiconductor elements can be photo-sensitive controlled avalanche diodes or controlled avalanche phototransistors. The light to be supplied can originate from a light-emitting diode (LED) which can be present for each semiconductor element. In that case, it is advantageous to combine diode and transistor in one unit to form a photo-coupling unit (optocoupler).

Another possibility is to use one light source (LED) and to conduct the light to each semiconductor element by optical means, such as optical fibres. This is to be preferred when very high voltages are used and a major consideration is to insulate those elements, which are at a high voltage, from the surroundings.

The circuit according to the invention can be used as a series regulator, as a parallel or shunt regulator or in a combination of both regulators. Especially the last-mentioned combination makes it possible to obtain a high-voltage amplifier which converts, for example, 0–1 V into 0–10 kV. A good switch is also obtained with this combination which switches a high voltage at a load, and without the remaining leakage current still producing with a high-ohmic load a considerable residual voltage across the load.

It will be apprecited that various applications can be found:

Stabilization of high voltages.

A desired waveform of high voltages, for example, the production of a sawtooth-shaped deflection voltage for electrostatic deflection in a flat display screen cathode-ray tube.

Metering and distribution in time of a high voltage, as in a multicylinder combustion engine so that an ignition coil and a mechanical distributor are no longer required.

Switching of high voltage for X-ray tubes and lasers.

A bilateral bipole obtained by arranging two circuits in series opposition.

In order to prevent oscillations, the photosensitive semiconductor elements may be electrostatically screened by a translucent screen, for example a gauze.

BRIEF DESCRIPTION OF THE DRAWINGS

The invention will be described more fully with reference to the drawings in which.

DESCRIPTION OF THE PREFERRED EMBODIMENTS

Figure 1:
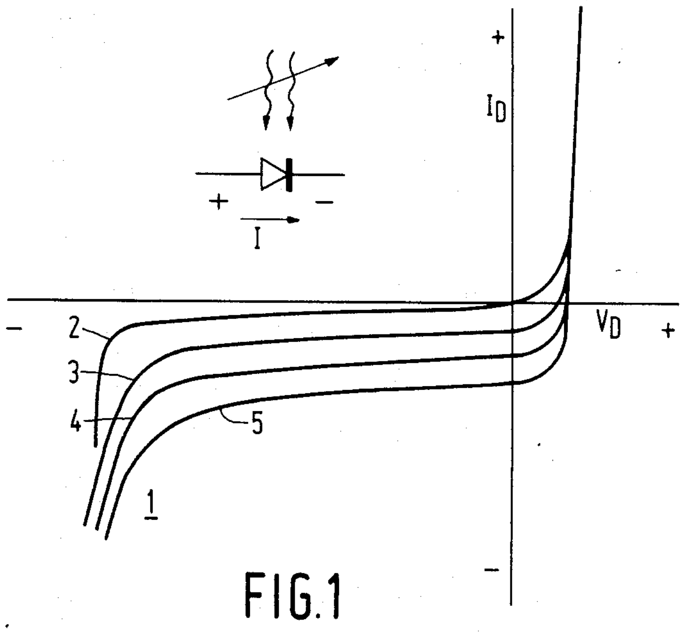
FIG. 1 represents a group of curves of a controlled avalanche diode as a function of the exposure.

FIG. 1 shows the current-voltage diagram of an irradiated controlled avalanche diode. The avalanche region is denoted by reference numeral 1. The curves 2, 3, 4 and 5 are obtained when the diode is irradiated from the dark level (2) with successively higher radiation intensities (3, 4 and 5).

Figure 2:
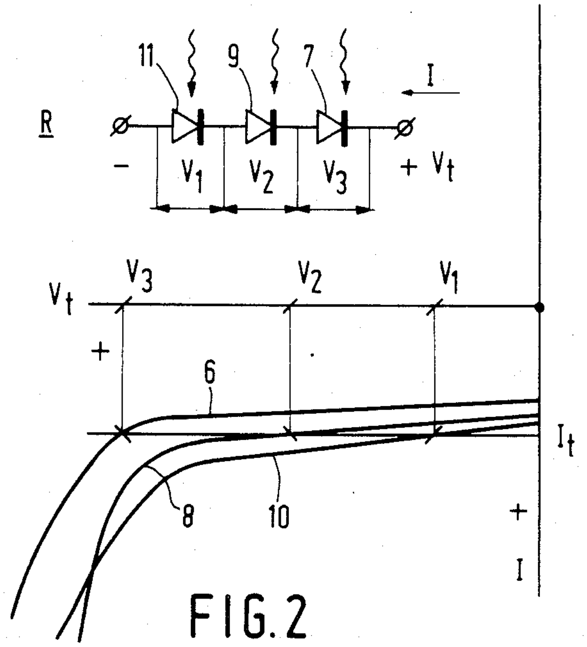
FIG. 2 shows the current-voltage diagram of a circuit of three controlled avalanche diodes with constant exposure, while the following Figures show embodiments of the invention.

In FIG. 2, three of these diodes are arranged in series to form a circuit R and are biassed with a reverse voltage $V_t$ across the assembly so that a current I will flow, which is of course equal for all diodes. Due to inequality in the irradiation and relative differences in the diodes, a current-voltage diagram 6 will be obtained for the diode 7 so that with the current $I_t$ there is associated a diode voltage $V_3$ substantially in the avalanche region. Likewise, a curve 8 is associated with the diode 9 giving a voltage $V_2$ and a curve 10 is associated with the diode 11 giving a voltage $V_1$. Since the curves in the avalanche region are fixed, and it is ensured that the heat development $I_t \times V$ avalanche remains within the maxima allowed for the diodes, a stable circuit is obtained which does not require any current regulation. The resistance obtained is given by the division of $V_t = V_1 + V_2 + V_3$ by the current $I_t$ and so will vary when the light intensity varies.

Figure 3:
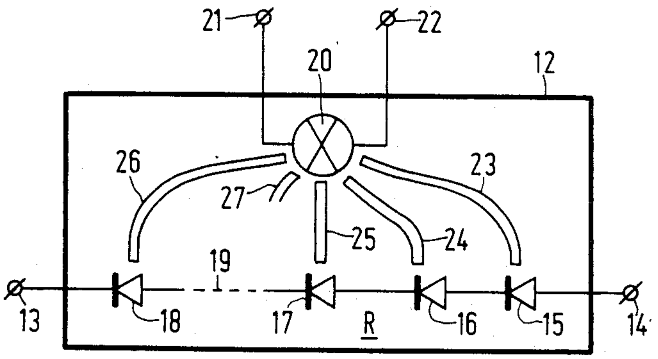
FIG. 3 shows a regulation device comprising one light source.

FIG. 3 shows a regulation device 12 which comprises, between two connection terminals 13 and 14, a circuit R comprising controlled avalanche diodes 15,16,17 and 18 and, as the case may be, a large number of further diodes at 19. A light source 20 is connected between the connection terminals 21 and 22 and irradiates the respective diodes via the light conductor paths indicated as optical fibres 23,24,25,26 and 27. As to the construction of the regulation device 12, in principle any high voltage at the circuit R can be accommodated by using moulding methods and suspension in oil.

Figure 4:
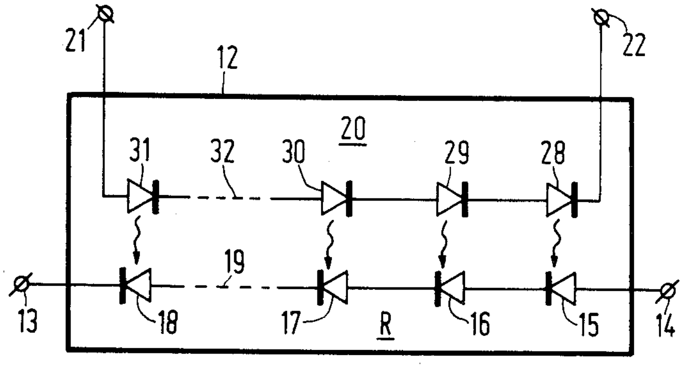
FIG. 4 shows a regulation device comprising light emitting diodes.

In FIG. 4 the regulation device 12 is provided with a light source 20 comprising light emitting diodes (LEDs) 28, 29, 30, 31 and 32 for the diodes 15,16,17,18 and 19, respectively. The light-emitting diodes are connected in series and emit light when a sufficient voltage is present across the "+" and "−" terminals 21 and 22, respectively.

Figure 5:
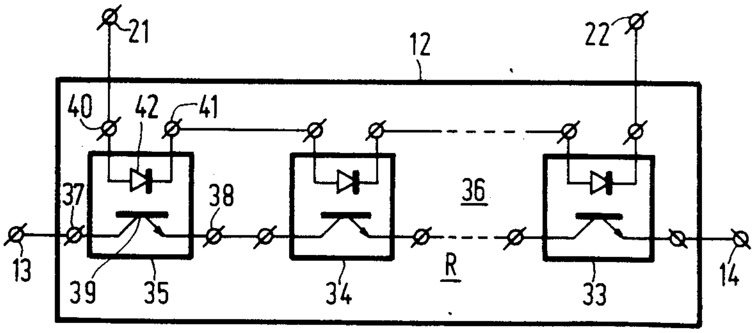
FIG. 5 shows a regulation device comprising an optocoupler.

In FIG. 5, a regulation device 12 is composed of optocouplers 33,34,35 and 36. Each optocoupler has connected connections (terminals) 37 and 38, between which a controlled avalanche phototransistor 39 is connected, and terminals 40 and 41 between which a light-emitting diode 42 is arranged. A fifth connection for the base of the phototransistor 39 is not used and is not shown either.

Figure 6:
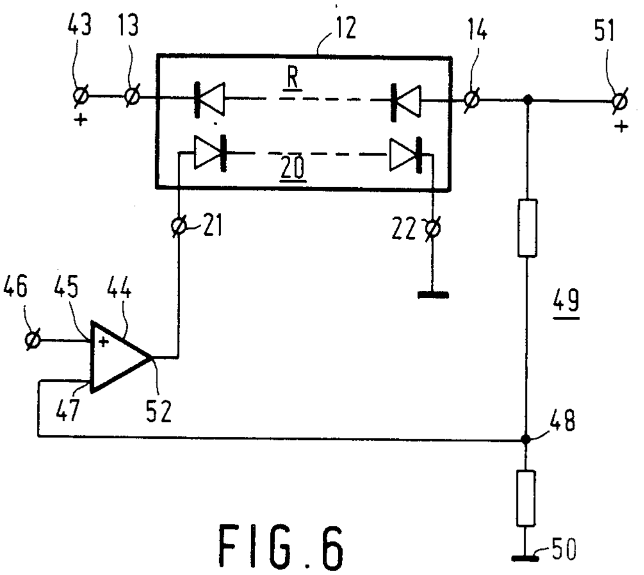
FIG. 6 shows a series regulator.

FIG. 6 shows a series regulator including a regulation device 12, whose variable resistance is constituted by the circuit R, to which a source of high voltage is connected through the terminal 13 via the terminal 43.

-A differential amplifier 44 is connected by means of its non-inverting input 45 to a low-voltage input 46 of the regulator and is connected by means of its inverting input 47 to the tap point 48 on a voltage divider 49, which is connected between ground 50 and the high-voltage output 51 of the regulator. The output 52 of the amplifier 44 is connected to the terminal 21 of the regulation device 12, while the terminal 22 is connected to ground. The circuit R is irradiated with such a quantity of light that a part of the high voltage at the terminal 43 appears at the output 51. This part is determined by means of a feedback control wherein the voltage proportional to this part at the points 48 and 47 is made equal to the low voltage supplied at the connection 46. This latter voltage is the reference value for the regulator. A deviation of the voltage at point 47 causes a higher or lower voltage to occur at the output 52, as a result of which the light sources in the regulation device 12 emit a larger or smaller quantity of light and thus counteract the original deviation and eliminate it as far as possible.

Figure 7:
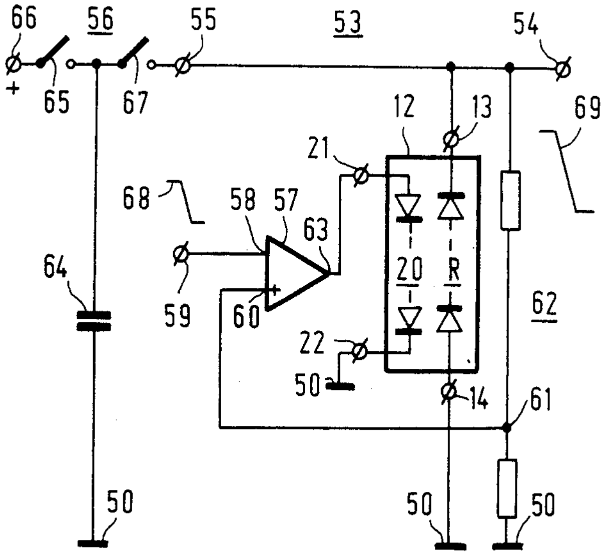
FIGS. 7 and 8 each show a shunt regulator.

FIG. 7 shows a shunt regulator 53. The terminal 13 of the regulation device 12 is connected to the high-voltage output 54 and to a connection 55 which is coupled to a high-voltage source 56. The terminal 14 is connected to ground 50. A differential amplifier 57 has an inverting input 58 connected to the low-voltage input 59 and its non-inverting input 60 connected to the tap point 61 on a voltage divider 62 arranged between ground 50 and the output 54. Amplifier 57 has an output 63 connected to the terminal 21 of the regulation device 12, whose terminal 22 is connected to ground 50. The high-voltage source 56 is represented here as a capacitor 64, which via the switch 65 is charged periodically from a source connected to the terminal 66. The charged capacitor 64 is connected at a given instant by means of a switch 67 to the terminal 55, while, for example, at the same time a decreasing voltage 68, e.g. a desired deflection voltage for a deflection unit etc., is supplied at the capacitor unit 59. The discharge via the circuit R is regulated so that an identical curve 69 is also obtained at the output 54.

Figure 8:
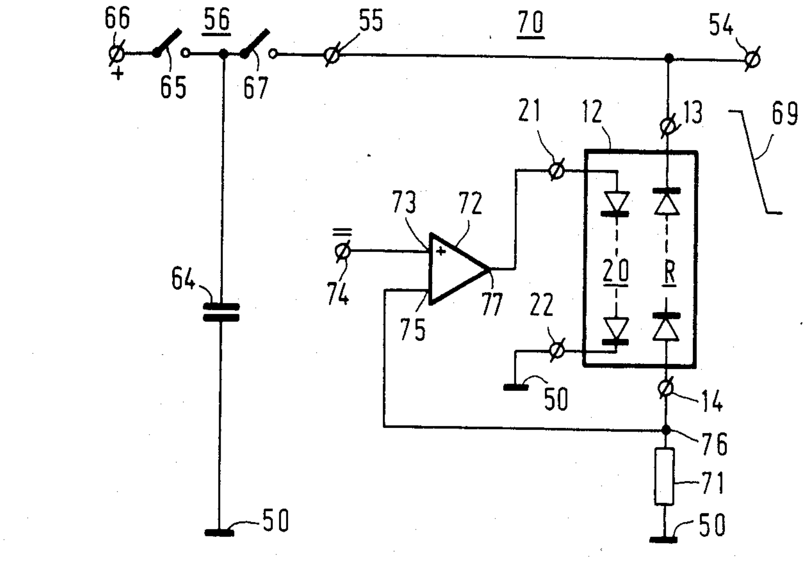

FIG. 8 shows a shunt regulator which corresponds to that shown in FIG. 7, but the voltage divider 62 is now replaced by a measuring resistor 71 which is included between the terminal 14 and ground 50. The differential amplifier 72 is connected by means of its non-inverting input 73 to the low-voltage input 74. The inverting input 75 is connected to the point 76 at the measuring resistor 71 and the output 77 is connected to the terminal 21. If a direct voltage is supplied to the input 74, a constant current is adjusted in the circuit R. This means that for a high-voltage source 56 a linear discharge is obtained and that the voltage curve 69 is obtained at the output 54.

Figure 9:
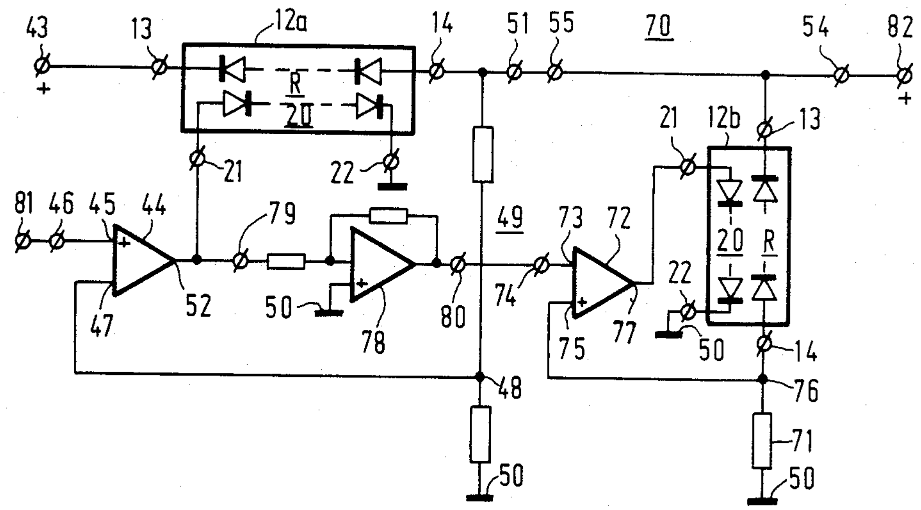
FIG. 9 shows a high-voltage amplifier.

FIG. 9 shows a high-voltage amplifier which is mainly composed of the series regulator shown in FIG. 6 and the shunt regulator shown in FIG. 8. Therefore, the corresponding reference symbols are used herein. In addition, an inverting amplifier 78 is provided which is connected by means of an input 79 to the output 52 of the amplifier 44 and which is connected by means of an output 80 to a low-voltage input 74 of the shunt regulator 70. Voltages supplied at the low-voltage input 81 are amplified linearly to high voltages, which can be derived from the high-voltage output 82 of the amplifier. In the regulation loop the amplifier 44 is the comparator and the divider 49 determines the amplification. However, since at lower input voltages the output 52 of the amplifier 44 could produce about 0 V, so that in the regulation device 12_a_ the source 20 does not emit light and the circuit R passes leakage current, this leakage current may still be so large that a voltage which is too large is produced at the output 82, i.e. at the tapping point 48. The amplifier 44 will then supply a negative voltage to the output 52. By means of the inverter amplifier 78, this voltage becomes positive and is supplied to the shunt regulator 70, which now takes up the leakage current originating from the output 51 and provides for its circuit R a resistance which causes the voltage at the output 82 to decrease to the correct extent. Thus, it is possible that for 0 V at the input 81 a fraction of the maximum high voltage appears at the output 82, which is consequently practically also 0 V.

Figure 10:
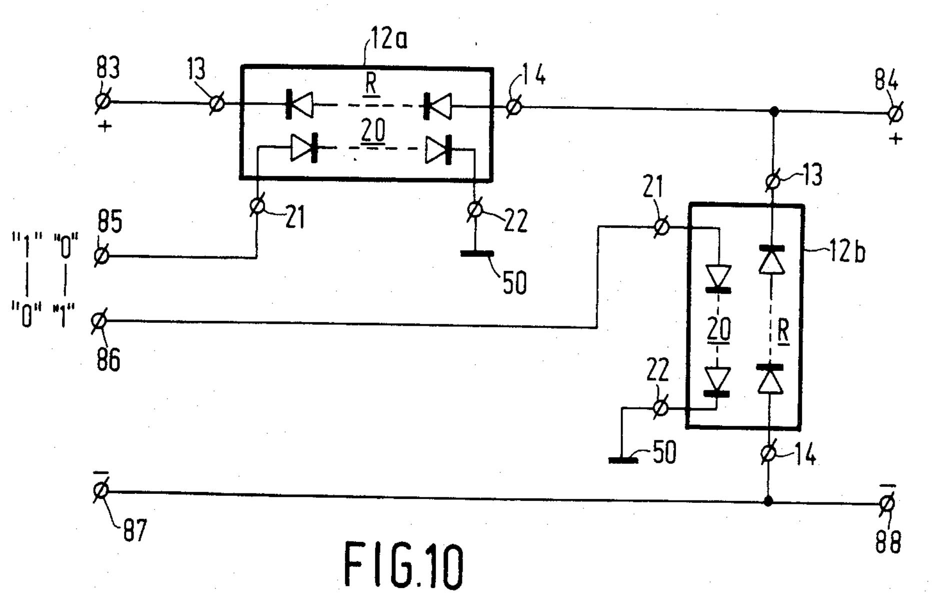
FIG. 10 shows a high voltage switch.

FIG. 10 shows the circuit diagram of a high-voltage switch which is particularly suitable for use in, for example, a non-mechanical distributor in an ignition system of a combustion engine. The connection 83 is connected to the source of high voltage, in the case of a car 15 to 30 kV. The output 84 may be connected to a cable with a load, in the case of a car the spark-plug. The regulation device 12a is arranged so that the circuit R is included between the connection terminals 83 and 84 and is rendered high-ohmic (cut-off state) and low-ohmic (conductive state) by the source 20. The regulation device 12b operates in phase opposition to 12a and serves to dissipate the leakage current of 12a. The connections 21 of the two regulation devices are connected to the control inputs 85 and 86, respectively, where the phase opposition relation is indicated by the digital symbols "0" and "1". The other connection 87 of the high-voltage source and the other output terminal 88 are connected to each other and to the connection terminal 14 of the device 12b and are generally also grounded.

Figure 11:
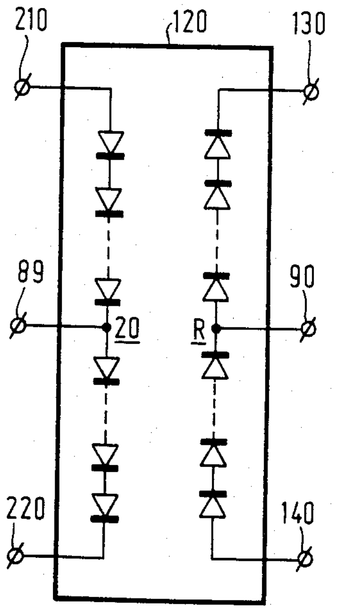
FIG. 11 shows a regulation device having centre tappings.

FIG. 11 shows a regulation device 120 which comprises two series-connected regulation devices 12 of the preceding Figures or is to be considered as a regulation device 12 having a centre tapping for the circuit R and for the light source 20.

Figure 12:
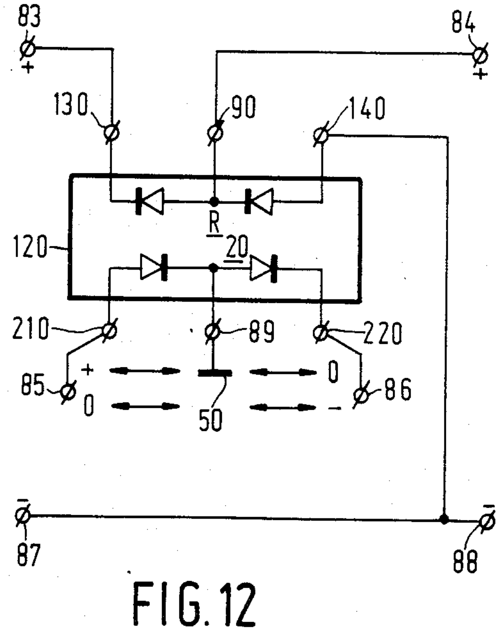
FIG. 12 shows the use thereof in a high-voltage switch.

In FIG. 12, the high-voltage switch of FIG. 10 is shown, but now with the use of a regulation device 120 shown in FIG. 11. For the control, the digital control signals "0" and "1" of FIG. 10 at the terminals 85 and 86 are replaced by a control signal "+" with respect to ground 50 at the terminal 85 and a control signal "−" at the terminal 86.

Figure 13:
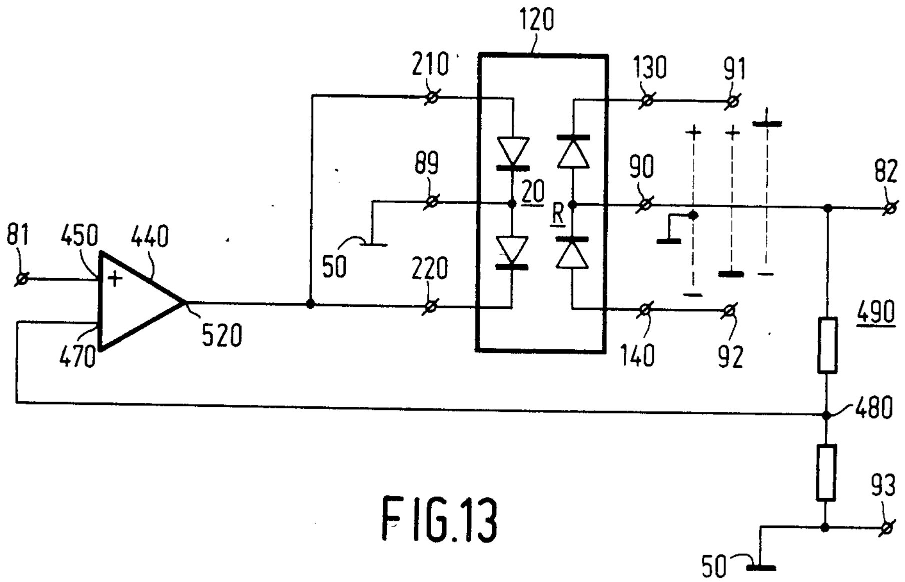
FIG. 13 shows the use thereof in a high-voltage amplifier.

FIG. 13 shows a high-voltage amplifier which is considerably simplified with respect to the circuit diagram of FIG. 9 by the use of a regulation device 120 as shown in FIG. 11. A source of high voltage is connected to the terminals 91 and 92. The three possible power supply arrangements are indicated by +, − and ground symbols. It is then possible to supply bipolar signals to the low-voltage input 81 or to supply thereto positive or negative signals, while the corresponding amplified output signals can be derived at the high-voltage output 82 with respect to the terminal 93 connected to ground 50. The voltage divider 490 with a tap point 480 and the differential amplifier 440 with inputs 450 and 470 and with an output 520 correspond to the same elements of FIG. 9 when the 0 in the reference symbol is omitted.

Figure 14:
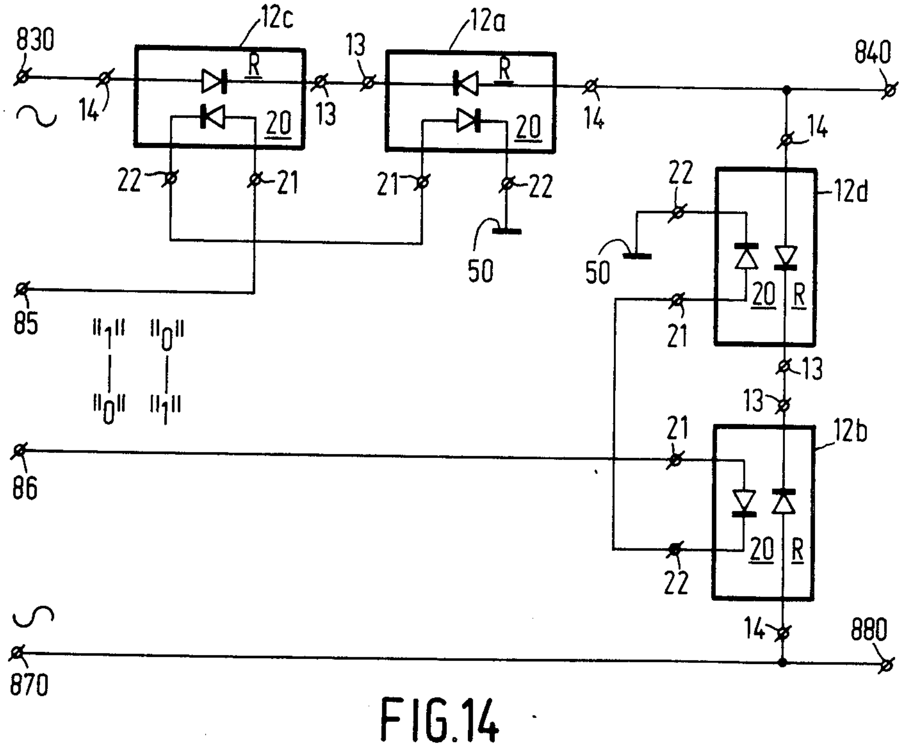
FIG. 14 shows a high-voltage switch for alternating voltages.

FIG. 14 shows a high-voltage switch for an alternating voltage. The circuit arrangement corresponds to that of FIG. 10. Corresponding terminals 83, 84, 87, 88 are indicated here by 830, 840, 870 and 880. A regulation device 12c is connected in series opposition to the regulation device 12a, while a regulation device 12d is connected in series opposition to the regulation device 12b. The light source circuits of 12a and 12c and of 12b and 12d are each connected in series, but may also be parallel-connected. In the case of an arrangement in parallel opposition, the control signals can be synchronously derived from the high-voltage alternating source. The light source 20 then receives a control signal only if the associated circuit R has to be switched. The other circuit R connected in series therewith thus operates only as a diode circuit biased in the forward direction and does not operate as a solar cell which produces direct voltage due to the irradiation.

What is claimed is:

1. A variable resistor circuit comprising a plurality of series-connected photosensitive controlled avalanche semiconductor elements each of which is provided with a region with a controlled avalanche characteristic, and means for supplying a controllable quantity of light to each of the semiconductor elements so that the circuit operates as a variable resistor whose overall resistance is a function of the quantity of light to be supplied to the semiconductor elements.

2. A variable resistor circuit as claimed in claim 1 characterized in that the semiconductor elements are photosensitive controlled avalanche diodes.

3. A variable resistor circuit as claimed in claim 2 wherein at least one of said photosensitive controlled avalanche diodes is operated substantially in its avalanche region.

4. A variable resistor circuit as claimed in claim 1, characterized in that the semiconductor elements are controlled avalanche phototransistors.

5. A variable resistor circuit as claimed in claim 1 characterized in that the photo-sensitive semiconductor elements are electrostatically screened by a translucent screen.

6. A regulation device comprising: a first terminal for connection to a source of voltage and a second terminal for connection to a load, a variable resistor circuit comprising a plurality of photosensitive controlled avalanche semiconductor elements series-connected between said first and second terminals and a plurality of light emitting diodes (LEDs) series-connected between third and fourth terminals which supply a controllable current to said LEDs, said LEDs being optically coupled to respective ones of said semiconductor elements so as to supply a controllable quantity of light to the semiconductor elements which in response operate as a variable resistor whose overall resistance is a function of the quantity of light supplied to the semiconductor elements, and fifth and sixth terminals connected to respective center taps of the series connected semiconductor elements and the series connected LEDs.

7. A series regulator comprising: a first terminal for connection to a source of high voltage, a second terminal for providing a high voltage output, a variable resistor circuit comprising a plurality of photosensitive controlled avalanche semiconductor elements series-connected between said first and second terminals and a light source connected between third and fourth terminals which supply a controllable current to said light source whereby the light source supplies a controllable quantity of light, said light source being optically coupled to said semiconductor elements so as to supply a controllable quantity of light to the semiconductor elements which in response operate as a variable resistor whose overall resistance is a function of the quantity of light supplied to the semiconductor elements, a voltage divider coupled between the high voltage output terminal and ground ahd having a tap point, a differential amplifier having a first input coupled to a low voltage input terminal of the regulator and a second input coupled to said tap point on the voltage divider, means for coupling an output of the differential amplifier to the third terminal, and means connecting the fourth terminal to ground.

8. A shunt regulator comprising: a first terminal for connection to a source of high voltage, a second terminal for providing a high voltage output, a variable resistor circuit comprising a plurality of photosensitive controlled avalanche semiconductor elements series-connected between said second terminal and ground and a light source connected between third and fourth terminals which supply a controllable current to said light source whereby the light source supplies a controllable quantity of light, said light source being optically coupled to said semiconductor elements so as to supply a controllable quantity of light to the semiconductor elements which in response operate as a variable resistor whose overall resistance is a function of the quantity of light supplied to the semiconductor elements, a voltage divider coupled between the high voltage output terminal and ground and having a tap point, means for DC connecting the first terminal to the second terminal, a differential amplifier having a first input coupled to a low voltage input terminal of the regulator and a second input coupled to said tap point on the voltage divider, means for coupling an output of the differential amplifier to the third terminal, and means connecting the fourth terminal to ground.

9. A shunt regulator as claimed in claim 8 further comprising:

a capacitor connected to ground, switching means alternately connecting said capacitor to said first and second terminals for charging the capacitor and periodically discharging same via the series-connected semiconductor elements, and wherein said low voltage input terminal is adapted for connection to a source of deflection voltage and said high voltage output terminal is adapted for connection to a deflection unit to which is applied an amplified replica of said deflection voltage.

10. A shunt regulator circuit comprising: a first terminal for connecting to a source of high voltage, a second terminal for providing a high voltage output, a variable resistor circuit comprising a plurality of photosensitive controlled avalanche semiconductor elements series-connected between first and second connection terminals and a light source connected between third and fourth terminals which supply a controllable current to said light source whereby the light source supplies a controllable quantity of light, said light source being optically coupled to said semiconductor elements so as to supply a controllable quantity of light to the semiconductor elements which in response operate as a variable resistor whose overall resistance is a function of the quantity of light supplied to the semiconductor elements, means connecting the first connection terminal to the high voltage output terminal and the second connection terminal to ground via a current measuring resistor, means connecting the first terminal to the second terminal, a differential amplifier having a first input coupled to a low voltage input terminal of the regulator and a second input coupled to said current measuring resistor, means for coupling an output of the differential amplifier to the third terminal, and means connecting the fourth terminal to ground.

11. A function generator comprising: a first terminal for connection to a source of high voltage, a second terminal for providing a high voltage output, a variable resistor circuit comprising a plurality of photosensitive controlled avalanche semiconductor elements series-connected between first and second connection terminals and a light source connected between third and fourth terminals which supply a controllable current to said light source whereby the light source supplies a controllable quantity of light, said light source being optically coupled to said semiconductor elements so as to supply a controllable quantity of light to the semiconductor elements which in response operate as a variable resistor whose overall resistance is a function of the quantity of light supplied to the semiconductor elements, means connecting the first connection terminal to the high voltage output terminal and the second connection terminal to ground via a current measuring resistor, means connecting the first terminal to the second terminal, a differential amplifier having a first input coupled to a low voltage input terminal of the regulator and a second input coupled to said current measuring resistor, means for coupling an output of the differential amplifier to the third terminal, and means connecting the fourth terminal to ground, a capacitor connected to ground, switching means alternately connecting said capacitor to said first and second terminals whereby the capacitor is periodically charged to a given voltage, and means for coupling the low voltage input terminal to a source of reference voltage thereby to derive a desired function at the high voltage output terminal.

12. A high voltage amplifier comprising: a first terminal for connection to a source of high voltage, a second terminal for providing a high voltage output, a first plurality of photosensitive controlled avalanche semiconductor elements series-connected between said first and second terminals, a first light source optically coupled to said semiconductor elements and having third and fourth terminals which supply a controllable current to said light source thereby to control the quantity of light supplied to the semiconductor elements, a second plurality of photosensitive controlled avalanche semiconductor elements series-connected between said high voltage output terminal and via a resistor to ground, a second light source optically coupled to the second plurality of semiconductor elements and having fifth and sixth terminals which supply a controllable current to said second light source thereby to control the quantity of light supplied to the semiconductor elements, a voltage divider coupled between the high voltage output terminal and ground, a first differential amplifier having a first input for connection to a low voltage input terminal of the amplifier and a second input coupled to a tap point on the voltage divider, a second differential amplifier having an output coupled to said fifth terminal, an inverter amplifier coupled between an output of the first differential amplifier and a first input of the second differential amplifier, means coupling a second input of the second differential amplifier to said resistor, means connecting the output of the first differential amplifier to the third terminal, and means coupling the fourth and sixth terminals to ground.

13. A high voltage amplifier comprising: a low voltage input terminal and a high voltage output terminal, a plurality of photosensitive controlled avalanche semiconductor elements series-connected between first and second connection terminals which are connected to first and second terminals of a source of high voltage, a plurality of light emitting diodes (LEDs) individually optically coupled to said plurality of semiconductor elements and series-connected between third and fourth connection terminals for supplying a controllable current to said LEDs, a voltage divider coupled between the high voltage output terminal and ground, a differential amplifier having first and second inputs coupled to the low voltage input terminal and to a tap point on the voltage divider, respectively, means connecting said third and fourth connection terminals to an output of the differential amplifier, fifth and sixth connection terminals connected to respective tap points in the series-connected semiconductor elements and the series-connected LEDs, and means connecting the fifth and sixth connection terminals to the high voltage output terminal and to ground, respectively.

14. A high voltage switch comprising: first and second input terminals and first and second output terminals, a first plurality of photosensitive controlled avalanche semiconductor elements series-connected between the first input terminal and the first output terminal, a second plurality of photosensitive controlled avalanche semiconductor elements series-connected between the first and second output terminals, first and second controlled light sources optically coupled to the first and second plurality of semiconductor elements, respectively, to control the current flow therein, means connecting the second input terminal to the second output terminal, and means for supplying to the first and second light sources control signals which are inverted with respect to each other.

15. A high voltage switch comprising: first and second input terminals and first and second output terminals, first and second pluralities of photosensitive controlled avalanche semiconductor elements connected in series opposition between the first input terminal and the first output terminal, third and fourth pluralities of photosensitive controlled avalanche semiconductor elements connected in series opposition between the first and second output terminals, first controlled light source means optically coupled to the first and second pluralities of semiconductor elements to control the current flow therein, second controlled light source means optically coupled to the third and fourth pluralities of semiconductor elements to control the current flow therein, means connecting the second input terminal to the second output terminal, and means for supplying to the first and second light source means control signals which are inverted with respect to each other.

16. A high voltage switch comprising: first and second input terminals and first and second output terminals, a plurality of photosensitive controlled avalanche semiconductor elements series-connected between first and second connection terminals, a plurality of light emitting diodes (LEDs) individually optically coupled to said plurality of semiconductor elements and series-connected between third and fourth connection terminals for supplying a controllable current to said LEDs, fifth and sixth connection terminals connected to respective tap points in the series-connected semiconductor elements and the series-connected LEDs, means connecting the first input terminal to the first connection terminal, means interconnecting the second input terminal, the second output terminal and the second connection terminal, means connecting the fifth connection terminal to the first output terminal, and means for applying a control signal between the third and sixth connection terminals to put the switch in a conductive state and for applying a control signal between the fourth and sixth connection terminals to put the switch in a cut-off state.

* * * * *